United States Patent [19]
Noriyuki

[11] Patent Number: 5,447,448
[45] Date of Patent: Sep. 5, 1995

[54] IC SOCKET

[75] Inventor: Matsuoka Noriyuki, Yokohama, Japan

[73] Assignee: Yamaichi Electronics Co., Ltd., Tokyo, Japan

[21] Appl. No.: 169,987

[22] Filed: Dec. 16, 1993

[30] Foreign Application Priority Data

Dec. 18, 1992 [JP] Japan .................................. 4-355596

[51] Int. Cl.⁶ .............................................. H01R 9/09
[52] U.S. Cl. ...................................... 439/331; 439/73
[58] Field of Search ............................ 439/68–73, 439/264, 330, 331, 525, 526

[56] References Cited

U.S. PATENT DOCUMENTS

| | | | |
|---|---|---|---|
| 4,758,176 | 7/1988 | Abe et al. | 439/73 |
| 4,887,969 | 12/1989 | Abe | 439/73 |
| 5,100,332 | 3/1992 | Egawa | 439/72 |
| 5,244,404 | 9/1993 | Kishi et al. | 439/73 |

Primary Examiner—Larry I. Schwartz
Assistant Examiner—Hien D. Vu
Attorney, Agent, or Firm—Wenderoth, Lind & Ponack

[57] ABSTRACT

An IC socket is provided in which an IC package is loaded on a socket base and a pressing cover is closed relative to the socket base to cause an IC pressing member mounted on the pressing cover to press leads on the IC package against contacts of the IC socket. The IC pressing member is provided with a plurality of unitary pressing pads, and the IC pressing member is shiftable to different pressing positions to utilize different unitary pressing pads.

16 Claims, 2 Drawing Sheets

IC SOCKET

BACKGROUND OF THE INVENTION

1. Field of the Invention

This invention relates to an IC socket in which an IC package is loaded on a socket base and a pressing cover is closed relative to the base to press the leads of the IC package against corresponding contacts.

2. Prior Art

As shown in FIG. 5, in a conventional IC socket, a pressing cover 2 is attached to one end of a socket base 1 such that the cover 2 can be opened and closed through a hinge 3. By closing the pressing cover 2 relative to the socket base 1 with an IC package 8 loaded thereon, leads 9 of the IC package 8 are uniformly pressed against contacts 4 by a pad 5a of an IC pressing member 5, which is pivotally mounted on the pressing cover 2, against resiliency of the contacts 4. A closing state of the pressing cover 2 relative to the socket base 1 is maintained by a lock lever 7. A similar construction to this prior art is disclosed in U.S. Pat. No. 4,758,176.

However, the socket having the above-mentioned construction has the following disadvantages. That is, since the pad 5a is disposed such that its pressing position corresponds to the leads 9 of one kind of IC package 8, the above conventional socket cannot be used for IC packages different from the above-mentioned IC package 8 and is thus uneconomical. Moreover, repeated use causes the pressing portion of the pad 5a to be worn, which results in a short service life, and thus the arrangement is uneconomical.

The present invention has been accomplished in order to obviate the above-mentioned disadvantages inherent in the prior art.

SUMMARY OF THE INVENTION

It is therefore an object of the present invention to provide an IC socket which can be used with different kinds of IC packages.

Another object of the invention is to provide an IC socket in which the service life of the socket can be prolonged.

A further object of the invention is to provide an IC socket which is simple in structure.

A still further object of the invention is to provide an IC socket which is economical.

According to the present invention, there is essentially provided, in order to achieve the above objects, an IC socket in which an IC package is loaded on a socket base and a pressing cover is closed relative to the socket base to press leads on the IC package against contacts by an IC pressing member mounted on the pressing cover, wherein the IC pressing member is provided with a plurality of unitary pressing pads, the IC pressing member being able to be shifted to respective pressing positions by the respective unitary pressing pads.

BRIEF DESCRIPTION OF THE DRAWINGS

FIGS. 4(A) and (B) are illustrations used for explaining the above embodiment in detail, wherein FIG. 4(A) is a cross-sectional view showing, on an enlarged scale, a state in which a unitary pad having a small width is in abutment with a lead.

DETAILED DESCRIPTION OF THE EMBODIMENT

Figure 1:
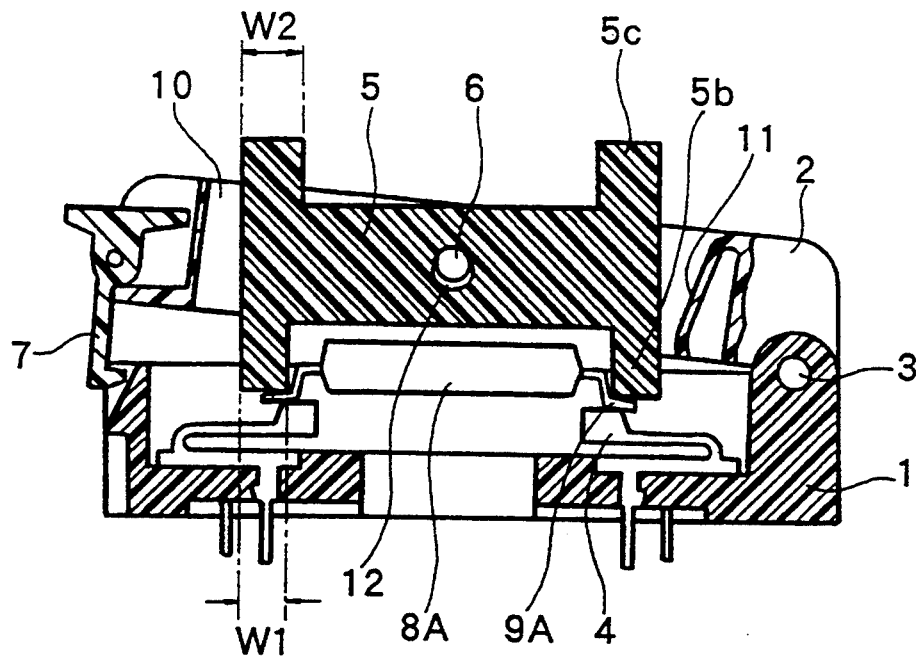
FIG. 1 is a cross-sectional view of an IC socket according to one embodiment of the present invention.

One embodiment of the present invention will be described with reference to FIGS. 1 through 4. Like parts of the prior art and the present invention are represented by like reference numerals.

This embodiment shows, as one example, a socket in which a pressing cover 2 is pivotally attached to one end of a socket base 1 through a hinge 3 as in the prior art.

Figure 2:
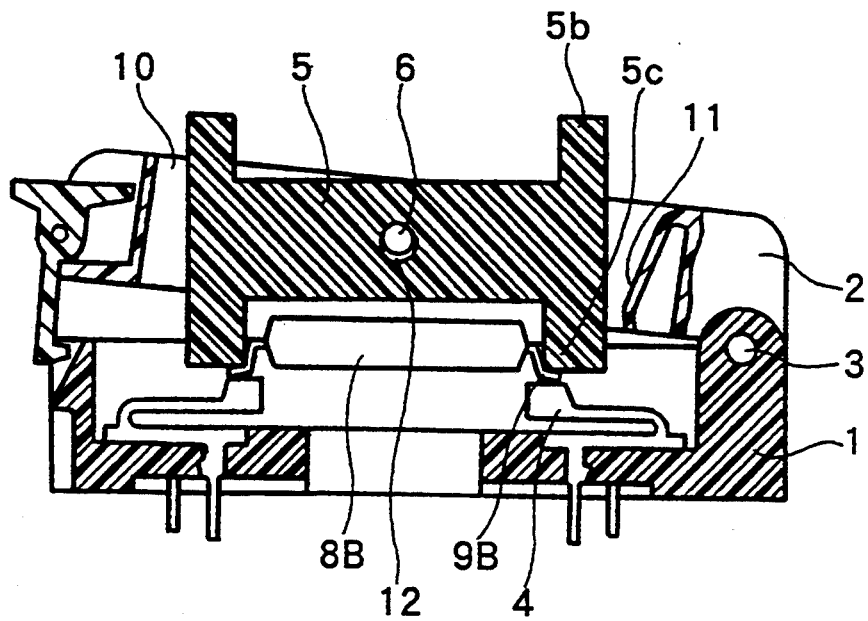
FIG. 2 is a cross-sectional view of the IC socket showing another example of use thereof.

In FIGS. 1 and 2, the socket base 1 is provided with a plurality of contacts 4 arranged at an area where an IC package 8 is loaded. An IC package 8A depicted in FIG. 1 has leads 9A which are different in projecting position from leads 9B on an IC package 8B which is depicted in FIG. 2. The IC packages 8A and 8B respectively have the leads 9A and 9B projecting sidewardly from two or four sides thereof. The leads 9A are different in projecting position and projecting length from the leads 9B. The contacts 4 are arranged along two or four sides of the area where the IC packages 8A and 8B are loaded, such that the contacts 4 can contact not only the leads 9A but also the leads 9B when the IC packages 8A and 8B have been loaded.

The pressing cover 2 can be opened and closed relative to the upper surface of the socket base 1 through the hinge 3. When the pressing cover 2 is closed, the leads are pressed against the contacts 4 and the IC package is positively retained. On the contrary, when the pressing cover 2 is opened, the contacting relation is removed and the IC package is ready to be unloaded.

In order to maintain the closing condition of the pressing cover 2, the pressing cover 2 is provided at a free end thereof with a lock lever 7 engageable with the socket base 1. It may be arranged such that the lock lever 7 is engageable with a cover 2 disposed on the socket base 1.

In the case where the pressing cover 2 has a window 10 and where an IC pressing member 5 is disposed within the window 10 and where the pressing cover 2 can be opened and closed through the hinge 3 as in the illustrated socket, the IC pressing member 5 is supported on the pressing cover 2 through a pin 6 parallel to a pin of the hinge 3, such that the IC pressing member 5 can be pivoted about the pin 6 in a lead pressing direction. The size of a pin hole 12 is chosen such that the pin 6 is loosely inserted therein and the cover 2 is loosely supported by the pin 6.

The IC pressing member 5 pivotally mounted on the pressing cover 2 is provided at two or four sides thereof with unitary pressing pads 5b and 5c in such a manner as to correspond to the above-mentioned leads arrangement (contact arrangement). As one embodiment, the lower unitary pressing pad 5b of FIG. 1 corresponds to the lead 9A on the IC package 8A, while the upper unitary pressing pad 5c of FIG. 1 corresponds to the leads 9B on the IC package 8B. In this way, a plurality of such unitary pressing pads 5b and 5c are arranged such that their pressing positions are different from one another.

More specifically, a distance between the unitary pressing pads 5b and 5b is larger than a distance between the unitary pressing pads 5c and 5c. In other words, a width $W_1$ of an end face (pressing face) of the unitary pressing pad 5b is smaller than a width $W_2$ of an end face (pressing face) of the other unitary pressing pad 5c so that the outer surfaces of the pressing pads 5b and 5c are in alignment with each other but the inner surfaces thereof are not in alignment.

Figure 4A:
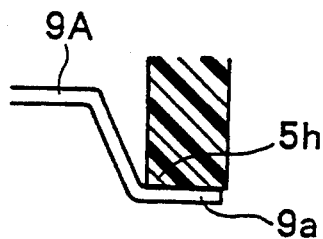
Figure 4B:
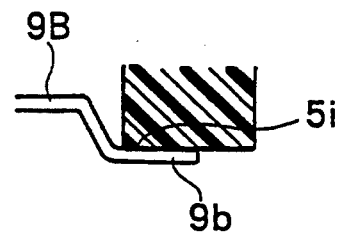
FIG. 4(B) is a cross-sectional view showing, on an enlarged scale, a state in which a unitary pad having a large width is in abutment with a lead.
Figure 5:
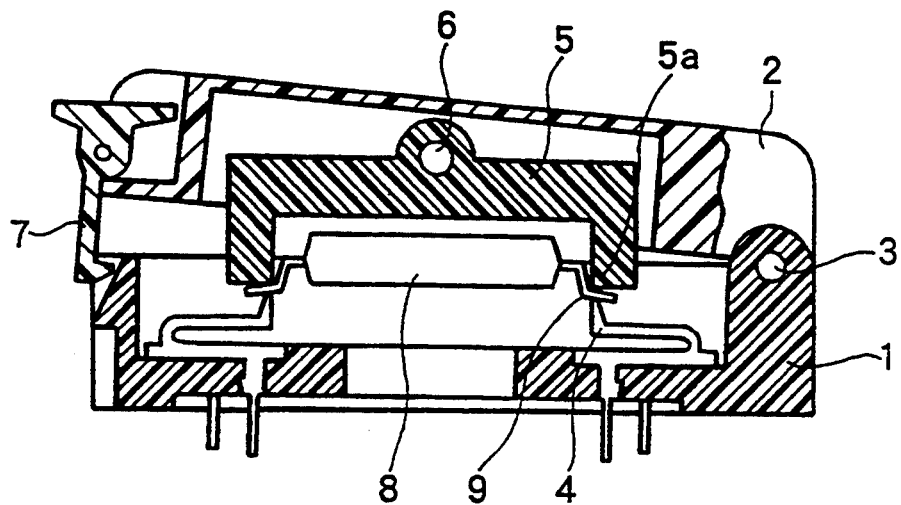
FIG. 5 is a cross-sectional view of a conventional IC socket.

Both the IC packages 8A and 8B are of a gull-wing type in which the leads 9A and 9B are bent twice. As shown in FIGS. 4(A) and (B), the end faces (pressing faces) of the unitary pressing pads 5b and 5c are abutted against the upper surfaces of distal bent elements 9a and 9b of the leads 9A and 9B such that bending angles of the distal bent elements 9a and 9b are restricted by inner corner portions 5h and 5i of the pads, respectively.

The pressing cover 2 is provided with a spring element 11 projecting from one side surface of the window 10. When the IC pressing member 5 is pivoted about the pin 6, this spring element 11 is caused to resiliently contact a side surface of the IC pressing member 5, and when the plurality of unitary pressing pads 5b and 5c are shifted in position upside down, the pivotal movement of the IC pressing member 5 is restricted by the resiliency of the spring element 11, so that inadvertent reverse rotation can be prevented.

In the case of the IC package 8A having the leads 9A as shown in FIG. 1, the IC pressing member 5 is pivoted about the pin 6 to cause the unitary pressing pad 5b having the smaller width to be shifted to the inner side of the cover 2, and then, the pressing cover 2 is closed relative to the socket base 1 on which the IC package 8A has been loaded. As a result, while the IC pressing member 5 is pivoted about the pin 6, the unitary pressing pad 5b uniformly presses the lead 9A of the IC package 8a against the contact 4 against the resiliency of the contact 4.

In the case of the IC package 8B having the lead 9B as shown in FIG. 2, after the IC pressing member 5 is pivoted about the pin 6 to bring the unitary pressing pad 5c to the inner side of the cover 2, the pressing cover 2 is simply closed relative to the socket base 1 on which the IC package 8B has been loaded, in the same manner as mentioned above.

According to the above embodiment, by shifting either of the plurality of unitary pressing pads 5b and 5c to the pressing position by pivoting of the IC pressing member 5, the socket of the above construction can easily be used with the different kinds of IC packages 8A and 8B.

In the above embodiment, the unitary pressing pads 5b and 5c are arranged such that the pressing positions are different. However, it may be arranged such that the pressing positions of the unitary pressing pads 5b and 5c are located in the same place, and when one of the unitary pressing pads is worn, the IC pressing member 6 is rotated by 180 degrees so that the other unitary pressing pad can be used.

Figure 3:
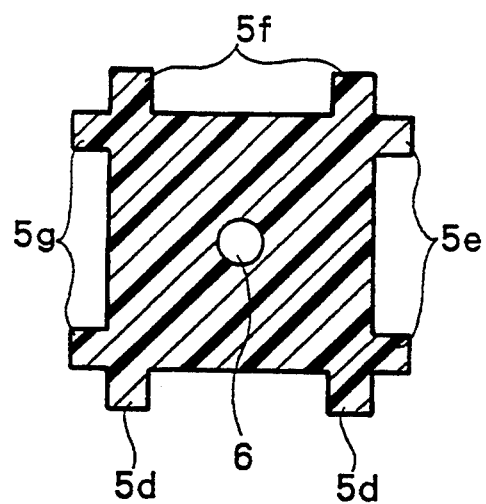
FIG. 3 cross-sectional view of an IC pressing member showing another example of the present invention.

In the embodiment of FIG. 3, a plurality of unitary pads 5d, 5e, 5f and 5g are arranged not only at upper and lower parts but also at right and left parts of the IC pressing member 5 pivotally disposed through the pin 6. In this case, the leads of the IC package can be pressed against the contacts by every 90 degrees rotation. As already mentioned, the unitary pressing pads 5d through 5g are arranged such that the pressing positions thereof are located in the same place in order to elongate the service life, or they are arranged such that the pressing positions thereof are located in different places in order to be usable with different kinds of IC packages.

The present invention is not limited to the above embodiments. For example, although not shown, the IC pressing member 5 can be slidably supported on the pressing cover 2 and a plurality of unitary pressing pads can be shifted to the respective pressing positions.

In the above mentioned embodiments, the pressing cover is connected to the socket base through the hinge such that the cover can be opened and closed relative to the base. Alternatively, the present invention is likewise applicable to a case where the pressing cover is not connected to but separated from the socket base with the same effect.

As described in the foregoing, according to the present invention, the plurality of unitary pressing pads are arranged such that the pressing positions thereof are located either in different places or in the same place, and then by shifting any of the unitary pressing pads to the pressing position, it becomes possible to use the IC sockets with different kinds of IC packages. Moreover, since when one pressing pad is worn, another pad can be shifted to the pressing position, the service life of the socket can be prolonged and the arrangement is thus economical.

What is claimed is:

1. An IC socket comprising:
   a socket base having an IC package receiving area;
   a plurality of contacts mounted to said socket base along a periphery of said IC package receiving area;
   a pressing cover openably mounted over said socket base for movement between open and closed positions;
   an IC pressing member, having first and second pairs of integral IC lead pressing pads, mounted to said pressing cover so as to be shiftable relative to said socket base between at least a first pressing position in which said first pair of IC lead pressing pads is positioned in an IC lead pressing position when said pressing cover is in said closed position, and a second pressing position in which said second pair of IC lead pressing pads is positioned in an IC lead pressing position when said pressing cover is in said closed position; and
   wherein said first pressing position of said IC pressing member is a different position of said IC pressing member relative to said socket base than said second pressing position of said IC pressing member, such that, when said IC pressing member is in said first pressing position, said first and second pairs of IC lead pressing pads are located at first positions, respectively, relative to said socket base and, when said IC pressing member is in said second pressing position, said first and second pairs of IC lead pressing pads are located at second positions respectively, relative to said socket base, said first positions being different relative to said socket base than said second positions.

2. An IC socket as recited in claim 1, wherein the IC lead pressing pads of said first pair of IC lead pressing pads each have a first predetermined thickness and are spaced apart from one another by a first predetermined distance, the IC lead pressing pads of said second pair of IC lead pressing pads each have a second predetermined thickness and are spaced apart from one another by a second predetermined distance, and at least one of the following conditions (a) and (b) is satisfied:

(a) said first predetermined thickness is different than said second predetermined thickness; and (b) said first predetermined distance is different than said second predetermined distance;

whereby, when said IC pressing member is in said first pressing position, the IC lead pressing positions of said first pair of IC lead pressing pads are different relative to said socket base than the IC lead pressing positions of said second pair of IC lead pressing pads when said IC pressing member is in said second pressing position.

3. An IC socket as recited in claim 1, wherein the IC lead pressing pads of said first pair of IC lead pressing pads each have a first predetermined thickness and are spaced apart from one another by a first predetermined distance;

the IC lead pressing pads of said second pair of IC lead pressing pads each have a second predetermined thickness and are spaced apart from one another by a second predetermined distance and said first and second predetermined thicknesses are equal to one another, and said first and second predetermined distances are equal to one another, whereby, when said IC pressing member is in said first pressing position, the IC lead pressing positions of said first pair of IC lead pressing pads relative to said socket base are the same as the IC lead pressing positions of said second pair of IC lead pressing pads relative to said socket base when said IC pressing member is in said second pressing position.

4. An IC socket as recited in claim 1, wherein said IC pressing member is pivotally mounted to said pressing cover for pivotal movement between said first and said second pressing positions.

5. An IC socket as recited in claim 4, further comprising a pivot pin mounted to said pressing cover, and a pin-receiving hole formed substantially centrally through said IC pressing member and receiving said pivot pin.

6. An IC socket as recited in claim 1, wherein said IC pressing member further has third and fourth pairs of integral IC pressing pads; and said IC pressing member is further shiftable relative to said socket base between a third pressing position in which said third pair of IC lead pressing pads is positioned in an IC lead pressing position when said pressing cover is in said closed position, and a fourth pressing position in which said fourth pair of IC lead pressing pads is positioned in an IC lead pressing position when said pressing cover is in said closed position.

7. An IC socket as recited in claim 6, wherein said IC pressing member has first and second opposing sides and third and fourth opposing sides;

said first and second pairs of IC pressing pads project outwardly from said first and second opposing sides, respectively; and said third and fourth pairs of IC pressing pads project outwardly from said third and fourth opposing sides, respectively.

8. An IC socket as recited in claim 1, wherein said IC pressing member has first and second opposing sides; and said first and second pairs of IC pressing pads project outwardly from said first and second opposing sides, respectively.

9. An IC socket comprising:

a socket base having an IC package receiving area;

a plurality of contacts mounted to said socket base along a periphery of said IC package receiving area;

a pressing cover openably mounted over said socket base for movement between open and closed positions;

an IC pressing member, having first and second pairs of integral IC lead pressing pads, movably mounted to said pressing cover for movement relative to said pressing cover between a first pressing position in which said first pair of pressing pads constitutes a pressing means for pressing leads of an IC package mounted in said IC package receiving area against said contacts, respectively, when said pressing cover is in said closed position, and a second pressing position in which said second pair of pressing pads constitutes a pressing means for pressing leads of an IC package mounted in said IC package receiving area against said contacts, respectively, when said pressing cover is in said closed position; and wherein said first pressing position of said IC pressing member is a different position of said IC pressing member relative to said socket base than said second pressing position of said IC pressing member, such that, when said IC pressing member is in said first pressing position, said first and second pairs of IC lead pressing pads are located at first positions, respectively, relative to said socket base and, when said IC pressing member is in said second pressing position, said first and second pairs of IC lead pressing pads are located at second positions respectively, relative to said socket base, said first positions being different relative to said socket base than said second positions.

10. An IC socket as recited in claim 9, wherein the IC lead pressing pads of said first pair of IC lead pressing pads each have a first predetermined thickness and are spaced apart from one another by a first predetermined distance, the IC lead pressing pads of said second pair of IC lead pressing pads each have a second predetermined thickness and are spaced apart from one another by a second predetermined distance, and at least one of the following conditions (a) and (b) is satisfied:

(a) said first predetermined thickness is different then said second predetermined thickness; and (b) said first predetermined distance is different than said second predetermined distance;

whereby, when said IC pressing member is in said first pressing position, IC lead pressing positions of said first pair of IC lead pressing pads are different relative to said socket base than IC lead pressing positions of said second pair of IC lead pressing pads when said IC pressing member is in said second pressing position.

11. An IC socket as recited in claim 9, wherein the IC lead pressing pads of said first pair of IC lead pressing pads each have a first predetermined thickness and are spaced apart from one another by a first predetermined distance;

the IC lead pressing pads of said second pair of IC lead pressing pads each have a second predetermined thickness and are spaced apart from one another by a second predetermined distance; and said first and second predetermined thicknesses are equal to one another, and said first and second predetermined distances are equal to one another, whereby, when said IC pressing member is in said first pressing position, IC lead pressing positions of said first pair of IC lead pressing pads relative to said socket base are the same as IC lead pressing positions of said second pair of IC lead pressing pads relative to said socket base when said IC pressing member is in said second pressing position.

12. An IC socket as recited in claim 9, wherein said IC pressing member is pivotally mounted to said pressing cover for pivotal movement between said first and said second pressing positions.

13. An IC socket as recited in claim 12, further comprising a pivot pin mounted to said pressing cover, and a pin-receiving hole formed substantially centrally through said IC pressing member and receiving said pivot pin.

14. An IC socket as recited in claim 9, wherein said IC pressing member further has third and fourth pairs of integral IC pressing pads; and said IC pressing member is further movable relative to said pressing cover between a third pressing position in which said third pair of pressing pads constitutes a pressing means for pressing leads of an IC package mounted in said IC package receiving area against said contacts, respectively, when said pressing cover is in said closed position, and a fourth position in which said fourth pair of pressing pads constitutes a pressing means for pressing leads of an IC package mounted in said IC package receiving area against said contacts, respectively, when said pressing cover is in said closed position.

15. An IC socket as recited in claim 14, wherein said IC pressing member has first and second opposing sides and third and fourth opposing sides;

said first and second pairs of IC pressing pads project outwardly from said first and second opposing sides, respectively; and said third and fourth pairs of IC pressing pads project outwardly from said third and fourth opposing sides, respectively.

16. An IC socket as recited in claim 9, wherein said IC pressing member has first and second opposing sides; and said first and second pairs of IC pressing pads project outwardly from said first and second opposing sides, respectively.

* * * * *